(12) United States Patent
Lee

(10) Patent No.: US 7,286,663 B2
(45) Date of Patent: Oct. 23, 2007

(54) ASYMMETRIC DIGITAL SUBSCRIBER LINE SYSTEM CAPABLE OF AUTOMATICALLY CONTROLLING RECEIPT GAIN AND METHOD THEREOF

(75) Inventor: Jung-Joo Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 692 days.

(21) Appl. No.: 10/725,145

(22) Filed: Dec. 1, 2003

(65) Prior Publication Data
US 2004/0125896 A1      Jul. 1, 2004

(30) Foreign Application Priority Data
Dec. 30, 2002    (KR)    ............ 10-2002-0086873

(51) Int. Cl.
*H04M 1/00* (2006.01)
*H04M 9/00* (2006.01)
(52) U.S. Cl. ............................ 379/390.01; 379/395
(58) Field of Classification Search ............ None
See application file for complete search history.

(56) References Cited

U.S. PATENT DOCUMENTS 5,594,760 A * 1/1997 Guillaud et al. ............ 375/345

2002/0131455 A1 * 9/2002 Cioffi et al. ............ 370/503
2006/0233227 A1 * 10/2006 Tzannes et al. ............ 375/219

FOREIGN PATENT DOCUMENTS

KR    02-0038044    5/2002

* cited by examiner

Primary Examiner—Ramnandan Singh
(74) Attorney, Agent, or Firm—Mills & Onello LLP

(57) ABSTRACT

A digital communication system includes a transmitter and a receiver and communicates on telephone line. Receipt gain of the digital communication system is controlled in accordance with the following. Initialization signals generated at the transmitter and transferred through the hybrid circuit on the telephone line are received for a predetermined time period. An average magnitude value of the initialization signal received during the time period is compared with a reference magnitude value. Receipt gain is controlled according to the difference between the average magnitude value of the receipt signal and a reference value. In this manner, when the system performance is changed according to permissible tolerance of the analog discrete components used in the ADSL system, gain of the gain amplifier is automatically controlled. Thus, the ADSL system can operate with optimal performance under given conditions.

23 Claims, 8 Drawing Sheets

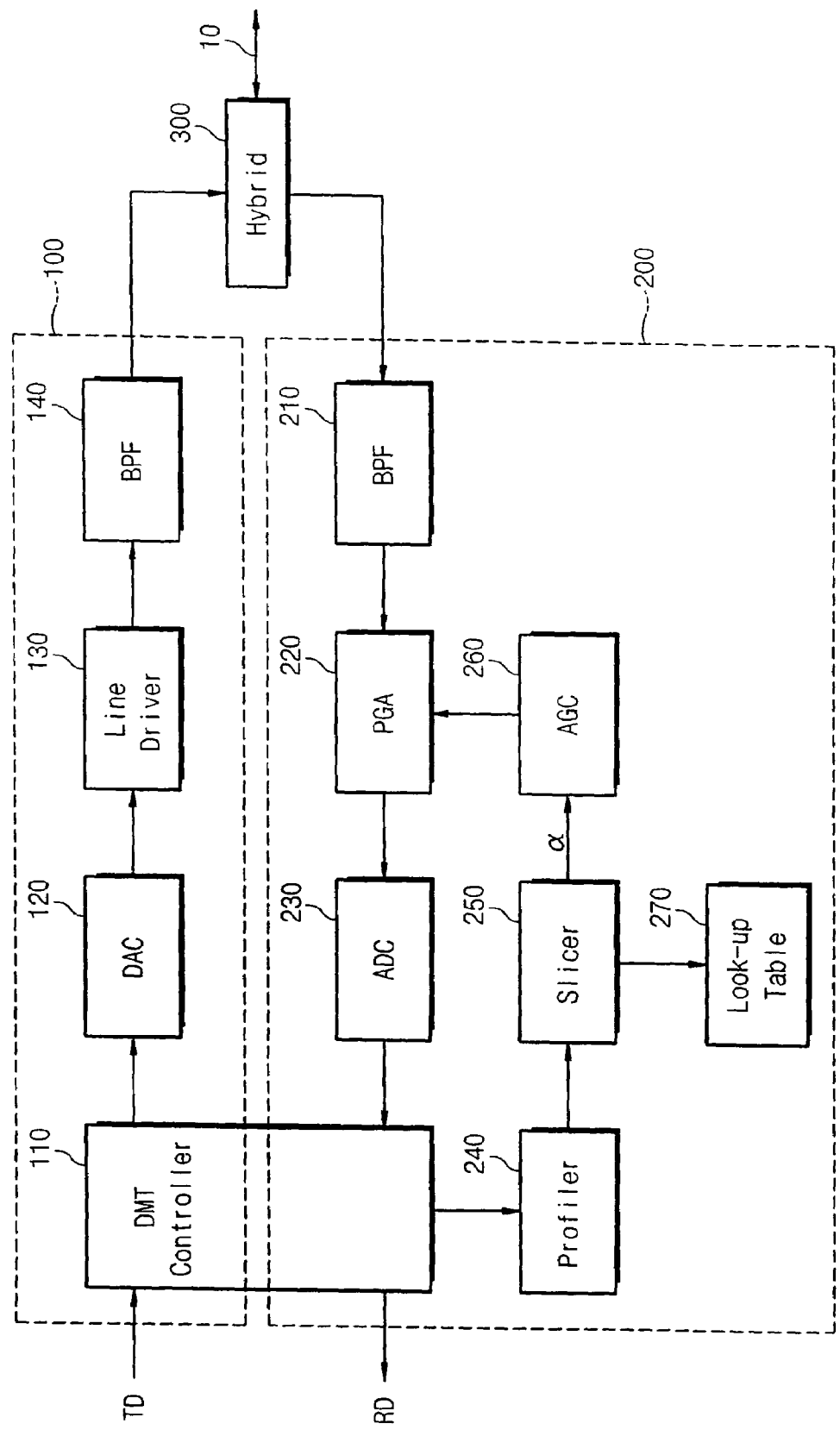

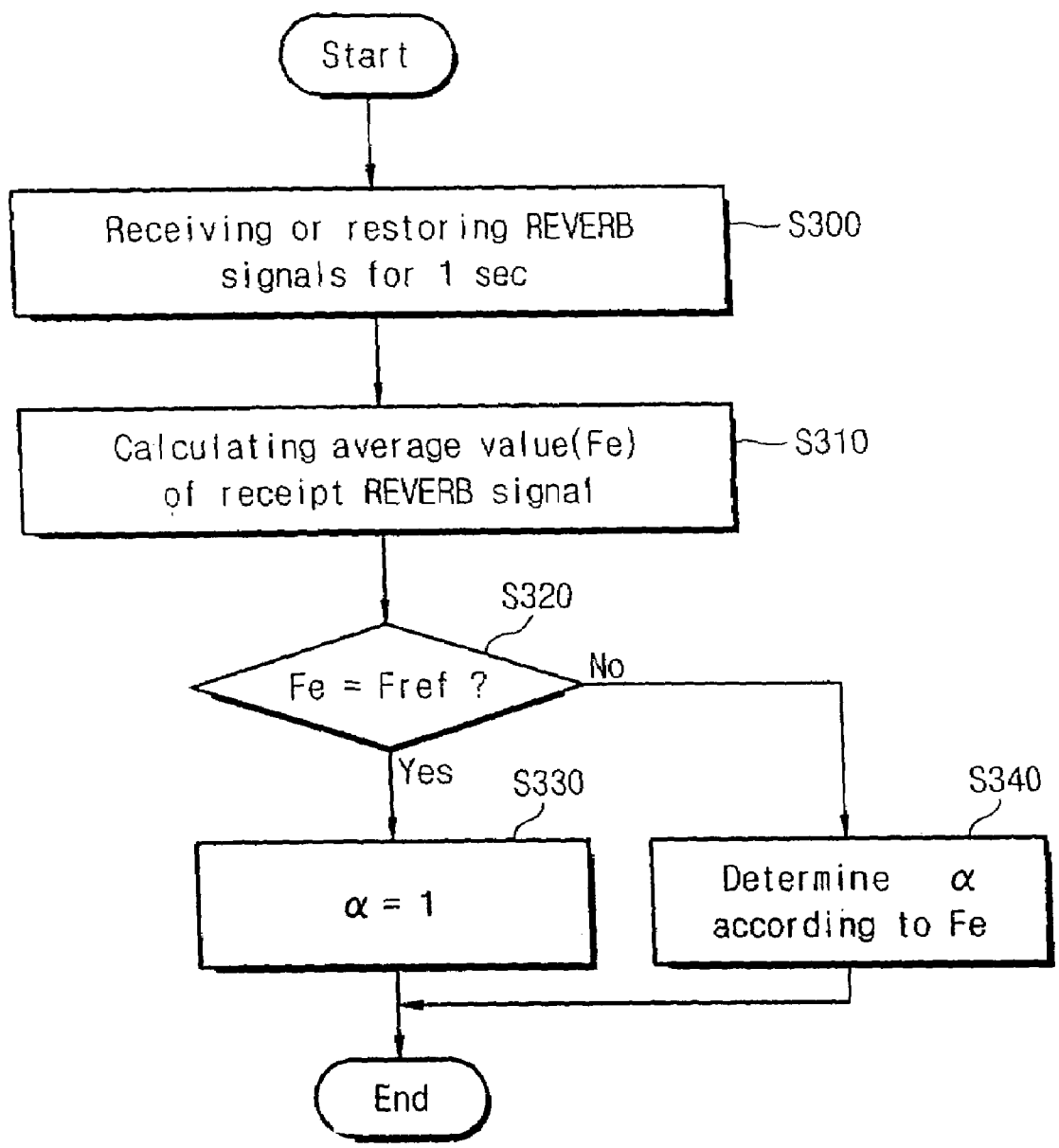

ASYMMETRIC DIGITAL SUBSCRIBER LINE SYSTEM CAPABLE OF AUTOMATICALLY CONTROLLING RECEIPT GAIN AND METHOD THEREOF

FIELD OF THE INVENTION

The present invention relates to data communication systems and, more particularly, to asymmetric digital subscriber line systems.

BACKGROUND OF THE INVENTION

With the widespread popularity of the Internet and personal computers, communication systems with low installation cost and low user fees have been required. As part of the recent establishment of new communication systems, digital subscriber lines and various modifications thereof (e.g., xDSL) that employ twisted pair copper wires that already exist in the telephone lines of every office and every home have become popular.

The term "xDSL" generally refers to numerous types of communication methods that utilize public telephone lines, and include high data-rate DSL (HDSL) for replacing T1 or E1 with twisted-pair copper line, symmetric DSL (SDSL) for transmitting a large amount of data in a Public Switched Telephone Network (PSTN), and so forth.

In another type of DSL system, namely the Asymmetric Digital Subscriber Line (ADSL), the term "Asymmetric" arises from the conditional background that downstream data transmitted from a central office CO to a remote terminal is wider in bandwidth and larger in size when compared to upstream data transmitted from the remote terminal RT to the central office CO. In this case, the downstream data is transmitted from the central office CO to the remote terminal RT. Signal transforming technology used in ADSL includes Carrierless Amplitude Phase modulation (CAP) type systems and Discrete Multi-Tone (DMT) type systems. The DMT type was commonly used by Bell Core of U.S.A. at first in 1993 and adopted as a standard of digital transmission at American National Standards Institute (ANSI), European Telecommunications Standards Institute (ETSI), and International Telecommunications Union (ITU). The DMT type is a method for transferring in parallel by a plurality of narrow band carrier waves. Therefore, the DMT type offers superior noise depression function and inferior interference with other communication lines, as compared to CAP. In addition, ADSL makes high rate data communication available through existing telephone service, and users utilize data communication together with plain old telephone service (POTS). The transmit rate of ADSL is up to 8Mbps for downstream data and 640kbps for upstream data.

The ADSL offers the advantage of using the existing telephone line, while suffering from the disadvantage of being affected by an inferior line environment. Thus, because of the existence of the inferior line environments such as ISDN, HDSL crosstalk and DSL crosstalk, ADSL standards regulate the minimum performance with respect each discrete component at each distance by defining the inferior line environments.

The ADSL is an asymmetric system in which upstream data and downstream data use different frequency bands and interfere with each other. Thus, system performance may be reduced. For example, near-end crosstalk (NEXT) and far-end crosstalk (FEXT) are main causes of reducing system performance of ADSL. The NEXT means that self-transmitting signal affects the receiving terminal, and the FEXT means that downstream data of another central office within an identical bundle affects the receiving terminal. The ADSL system utilizes a telephone line as the data communication medium and includes processes for transmitting and receiving analog signals. The processes for transmitting and receiving are performed in an identical telephone line and utilize an analog filter. However, discrete components consisting of the analog filter for dividing or integrating transmitted and receipt signals have permissible tolerance with respect to given values, such that each analog filter has different characteristics. Different analog filter characteristics mean variation the reflection signals generated by a transmission signal at a receiving terminal. This affects automatic receipt gain control, thereby preventing the system from having optimized performance under given conditions, or inducing system instability.

Conventional automatic receipt gain control determines a maximum value of the received signals and controls a programmable gain amplifier, a scaler, and so on, in order to cause the magnitude of the signal to have a maximum value under given conditions. However, in the case where the characteristic of the analog filter is different from what is used when the maximum value of the receipt signals is determined, the magnitude of the reflected signals, which are generated by the transmission signal at receiving terminal, varies to distort the maximum value of the received signals. That is, the maximum value of the received signals may be judged as being identical to the maximum value defined by the automatic gain control, even though the maximum value of the receipt signals is actually lower. In this case, the system performance is not optimized under the given condition, and is therefore reduced.

SUMMARY OF THE INVENTION

Therefore, the present invention provides an asymmetric digital subscriber line system having optimized capacity under given conditions.

The present invention also provides an asymmetric digital subscriber line system for controlling receipt gain automatically and a method thereof.

In a first aspect, the present invention is directed to a method for controlling receipt gain in a digital communication system including a transmitter and a receiver for communicating data on a telephone line. An initialization signal is received through a hybrid circuit for a time period, wherein the initialization signal is output by the transmitter and transferred on the telephone line. An average magnitude value of the initialization signal received during the time period is compared with a reference magnitude value. The receipt gain is controlled according to a difference between the average magnitude value of the received initialization signal and the reference magnitude value.

In one embodiment, the receipt gain is decreased when the average magnitude value of the received initialization signal is larger than the reference magnitude value. The receipt gain is increased when the average magnitude value of the received initialization signal is smaller than the reference magnitude value.

The digital communication system may comprise, for example, an asymmetric digital subscriber line (ADSL), in which case, the initialization signal is a REVERB signal, or a MEDLEY signal.

The time period corresponds, for example, to 10 frames of signals.

In another aspect, the present invention is directed to a digital communication system for communicating using telephone line. A hybrid circuit is connected to the telephone line. A transmitter transmits an initialization signal on the telephone line through the hybrid circuit. receiver includes an amplifier for amplifying signals received through the hybrid circuit. The receiver controls gain of the amplifier according to difference between a first magnitude value of an initialization signal received through the hybrid circuit at the receiver during a time period and a second reference magnitude value.

In one example, the receiver decreases gain of the amplifier when the average magnitude value of the received initialization signal is larger than the reference magnitude value. The receiver increases receipt gain when the average magnitude value of the received initialization signal is smaller than the reference magnitude value.

The receiver comprises, for example, a demodulator for demodulating signals amplified by the amplifier; and a gain controller for storing signals demodulated by the demodulator received during the time period time and for controlling the gain of the amplifier according to a difference between the average magnitude value of the stored signal and the reference magnitude value.

The gain controller comprises, for example, a profiler for storing the signals demodulated by the demodulator during the time period; a look-up table for defining compensation values corresponding to differences between the magnitude of the received initialization signal and the reference magnitude value; a slicer for calculating an average magnitude value of the signals stored in the profiler and determining a compensation value according to a difference between the average magnitude value and the reference magnitude value with reference to the look-up table; and an automatic gain controller for controlling gain of the amplifier according to the determined compensation value.

A DSL system in accordance with the present invention controls gain of the gain amplifier automatically, even when the system performance is modified in accordance with a permissible tolerance of the analog discrete components. Thus, the ADSL system is capable of achieving optimal performance under given conditions.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIG. 1 is a block diagram showing an asymmetric digital subscriber line (ADSL) system according to an exemplary embodiment of the present invention;

FIG. 5 is a flow chart of a diagnosis procedure according to an exemplary embodiment of the present invention;

DETAILED DESCRIPTION OF PREFERRED EMBODIMENTS

Figure 2A:
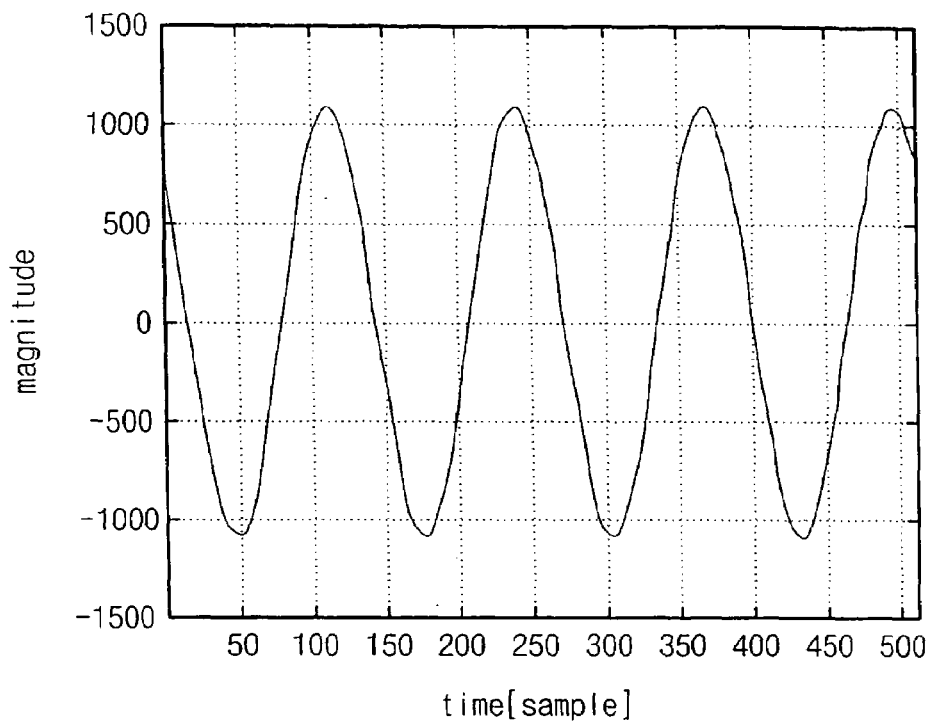
FIG. 2A is a graph showing waveforms of signals transmitted from a transmitter.

The present invention will now be described more fully hereinafter with reference to the accompanying drawings, in which exemplary embodiments of the invention are shown.

The system and method of the present invention detect the magnitudes of reflect signals generated by a transmission signal at a receiving terminal, and compensate a maximum value (i.e., a reference value) defined by automatic gain control when characteristics of an analog filter are changed due to permissible tolerance of discrete components in an asymmetric digital subscriber line (ADSL) using multi-tone. In this manner, system performance is improved under given conditions.

FIG. 1 is a block diagram showing an asymmetric digital subscriber line (ADSL) system according to an exemplary embodiment of the present invention.

Referring to FIG. 1, an ADSL system includes hybrid 300 used for dividing or integrating signals received via a telephone line 10. A transmitting part 100 of an ADSL modem comprises a discrete multi-tone (DMT) controller 110 for performing an inverse fast Fourier transform (IFFT) operation in order to transmit transfer data (TD) using a plurality of signals and converting the transmitted data into digital signals. In addition, the transmitting part of the ADSL modem comprises a digital-analog converter (DAC) 120 for converting the digital signal to analog signal, a line driver 130 and a band pass filter (BPF) 140.

A receiving part 200 of ADSL modem comprises a band pass filter 210, a programmable gain amplifier (PGA) 220, an analog-digital converter (ADC) 230 and a DMT controller 110. Contrary to the transmitting part, the band pass filter 210 performs filtering by accepting analog signals received through the hybrid 300. The programmable gain amplifier 220 amplifies the filtered analog signals. The DMT controller 110 slices a plurality of signals using fast Fourier transform (FFT) and restores the signals to original signals (RD). In the exemplary embodiment, the DMT controllers 110 of the transmitting part 100 and the receiving part 200 are embodied in a single chip.

In order to control receipt gain of the amplifier 220, the ADSL system of the present invention includes a profiler 240, a slicer 250, an automatic gain controller (AGC) 260, and a look-up table 270.

The ADSL system uses multi-tone signals, such that magnitudes of the received/transmitted analog signals are proportional to magnitude of a narrow band signal and number of the narrow band signal used for communication.

The transmission signal Xn may be represented by Fourier transform and is expressed by formula 1.

$$Xn = \frac{1}{\sqrt{N}} \sum_{n=0}^{N-1} X_i e^{-j\frac{2\pi}{N}in} \qquad \text{<formula 1>}$$

Figure 2B:
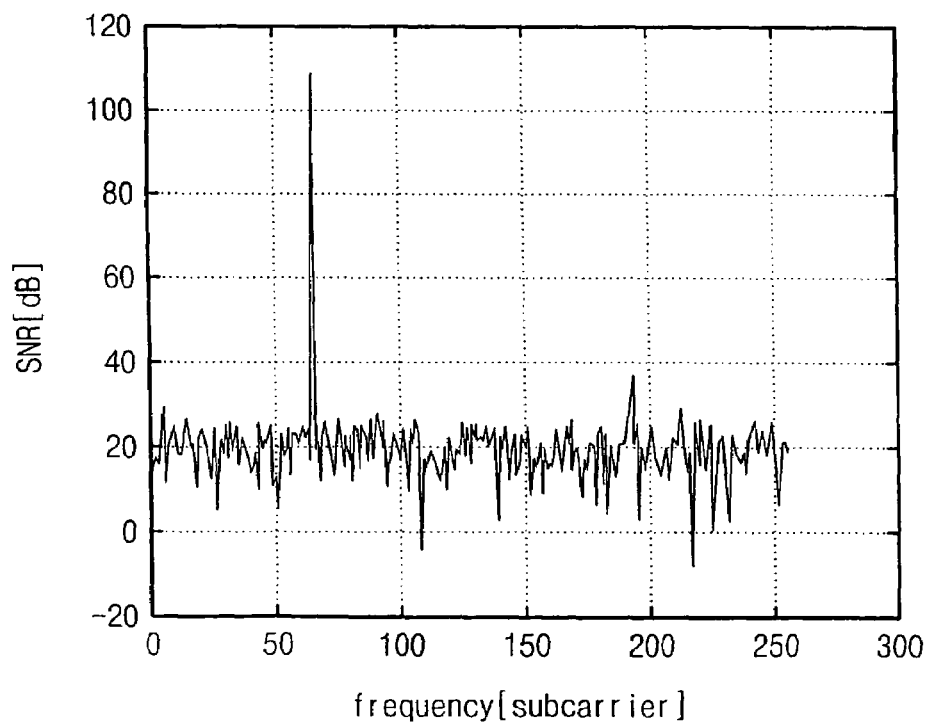
FIG. 2B is a graph showing frequency characteristics of the transmission signals of FIG. 2A.
Figure 2C:
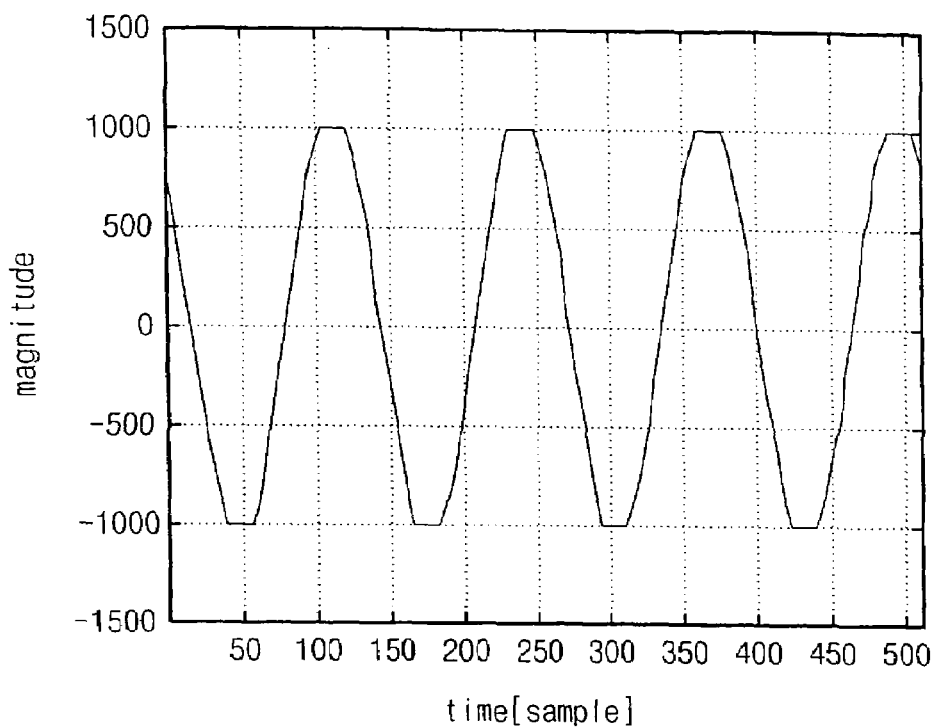
FIG. 2C is a graph showing the waveforms of the transmission signals of FIG. 2A as received at a receiver through a hybrid circuit.
Figure 2D:
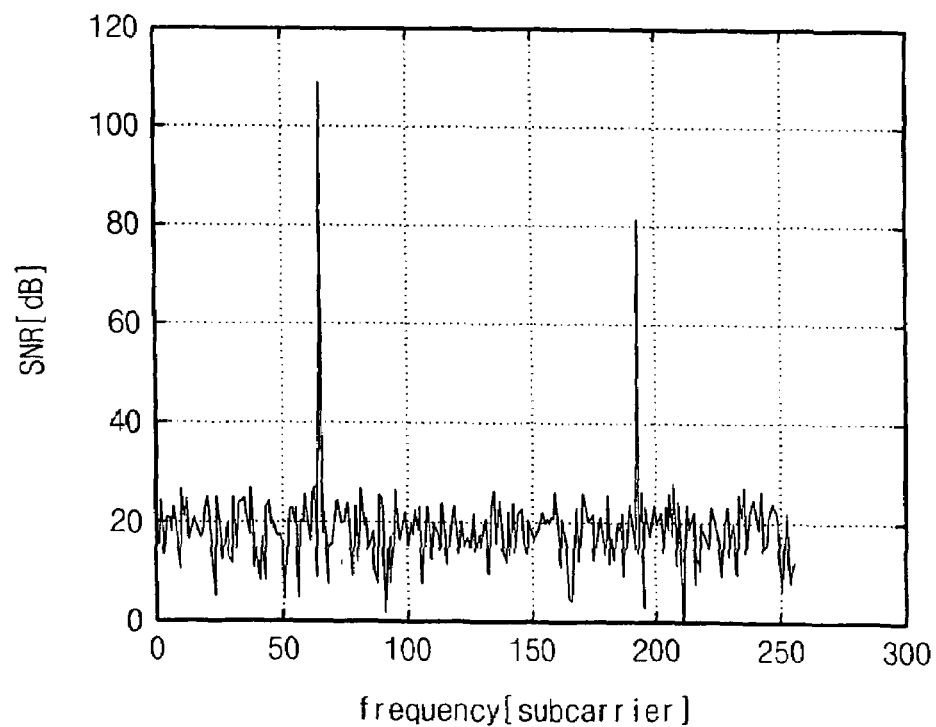
FIG. 2D is a graph showing frequency characteristics of the received transmission signals of FIG. 2C.

It can be known from the formula 1 that the maximum value of transmission signals Xn is proportional to |Xi| and N. In order to receive the transmission signals properly without losing the given information at a receiving part of the modem, a method for preventing distortion of the analog signals is required. An automatic receipt gain controller detects the received analog signals and decreases the magnitude of the receipt signals when the magnitude is too large. Meanwhile, the automatic receipt gain controller amplifies the signals when the magnitude of the receipt signals is too small. Automatic receipt gain control requires one reference value to judge the magnitude of the receipt signals. When the magnitude of the receipt signal is larger than the reference value, a portion of the signal is sliced to generate harmonic noise in the frequency domain. This may affect the other narrow band signals. When the magnitude of the receipt signal is smaller than the reference value, the magnitude of the receipt signal in the frequency domain is smaller than the noise components. Thus, data smaller in magnitude than that capable of being transmitted is transferred, thereby lowering system performance. FIG. 2A shows waveforms of the transmission signals from the transmitter. FIG. 2B shows the frequency characteristics of the transmission signal of FIG. 2A. FIG. 2C illustrates waveforms of the signal of FIG. 2A as received at a receiver through a hybrid circuit. FIG. 2D shows frequency characteristics of the transmission signal of FIG. 2C. As illustrated in FIG. 2C, in the case where the maximum magnitude of the receipt signal is larger than the quantization range (+1000 ~-1000) of an analog-digital converter 230, the receipt signal may not be correctly restored to the original data by the DMT controller 110. Accordingly, if the maximum magnitude of the receipt signal is beyond the quantization range of the analog-digital converter 230, gain of the amplifier 220 should be controlled to reduce the magnitude of the receipt signal.

Methods for controlling the gain of the amplifier 220 include one that utilizes frequency components of the receipt signal and another that utilizes time components of the receipt signal. The method that uses frequency components of the receipt signal observes only the concerned frequency domain to control the signals. In this method, processes for determining frequency region, which should be observed, under given condition and judging dimension of the frequency domain are important because the maximum value of the analog signal is varied depending on the number of the narrow band signal used in ADSL system. Meanwhile, a method of detecting an envelope of the receipt signal and controlling the receipt signal in the time domain has an advantage of achieving most proper performance with respect to the line attenuation that increases with increasing line distance, whereas this method has the disadvantage of being subject to noise components.

Figure 3A:
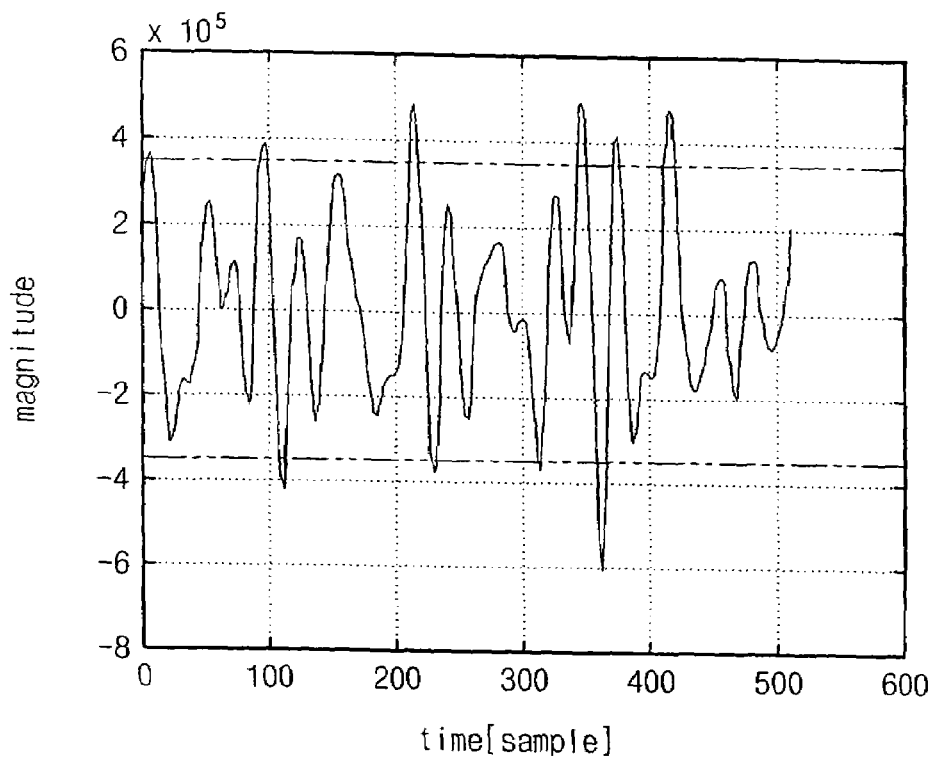
FIG. 3A is a graph showing waveforms on a telephone line.
Figure 3B:
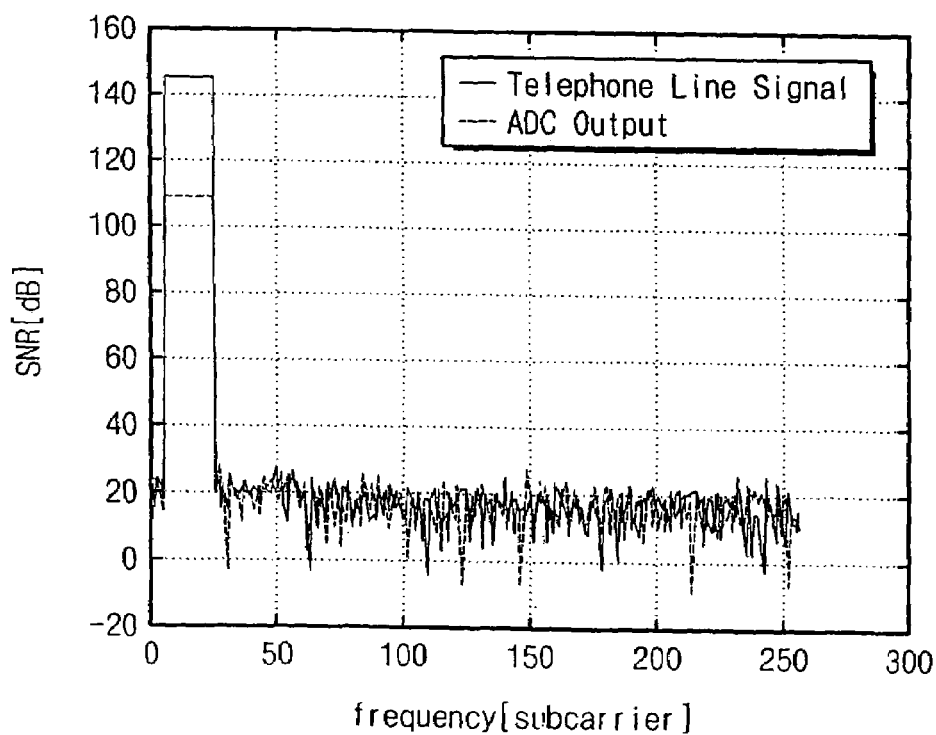
FIG. 3B is a graph showing characteristics of automatic gain control in the frequency domain.
Figure 3C:
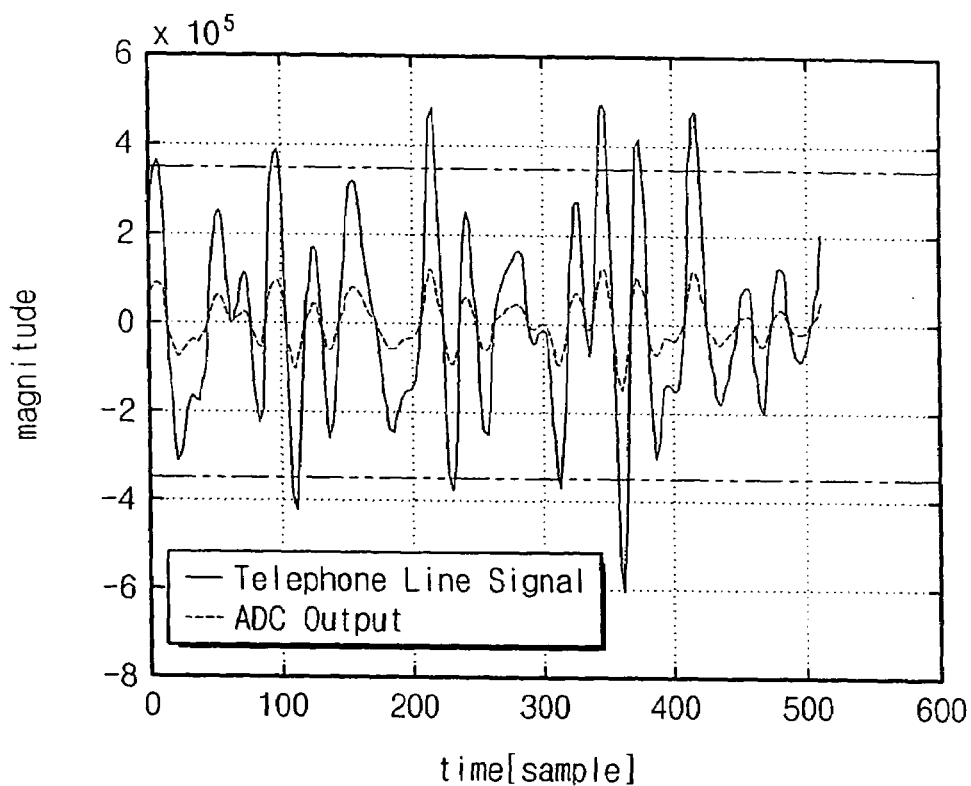
FIG. 3C is a graph showing characteristics of automatic gain control in the time domain.

FIGS. 3A through 3C show a method for performing automatic receipt gain control. FIG. 3A shows wave forms of the signals on a telephone line 10 in the time domain. FIG. 3B shows characteristics of automatic gain control in the frequency domain and FIG. 3C shows characteristics of automatic gain control in the time domain. In FIGS. 3B and 3C, the dotted line illustrates characteristics of the receipt signal and the solid line illustrates a reference value that is controlled in order to achieve optimal performance of the ADSL system.

Figure 4A:
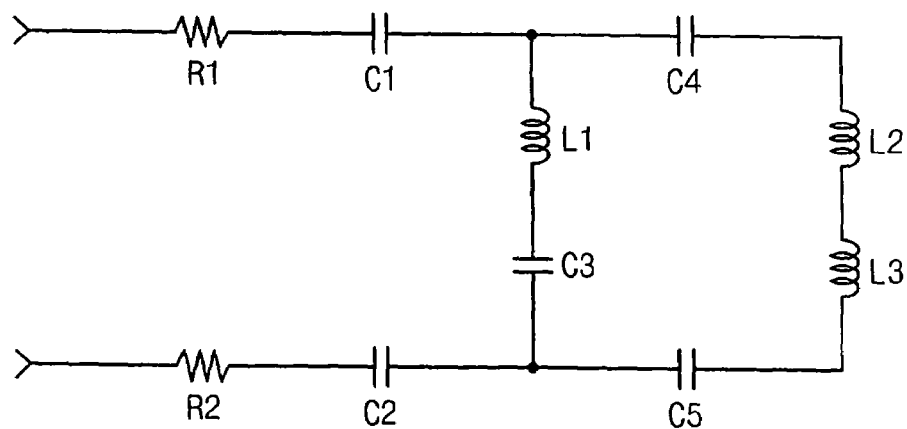
FIG. 4A is a circuit diagram of a hybrid circuit.
Figure 4B:
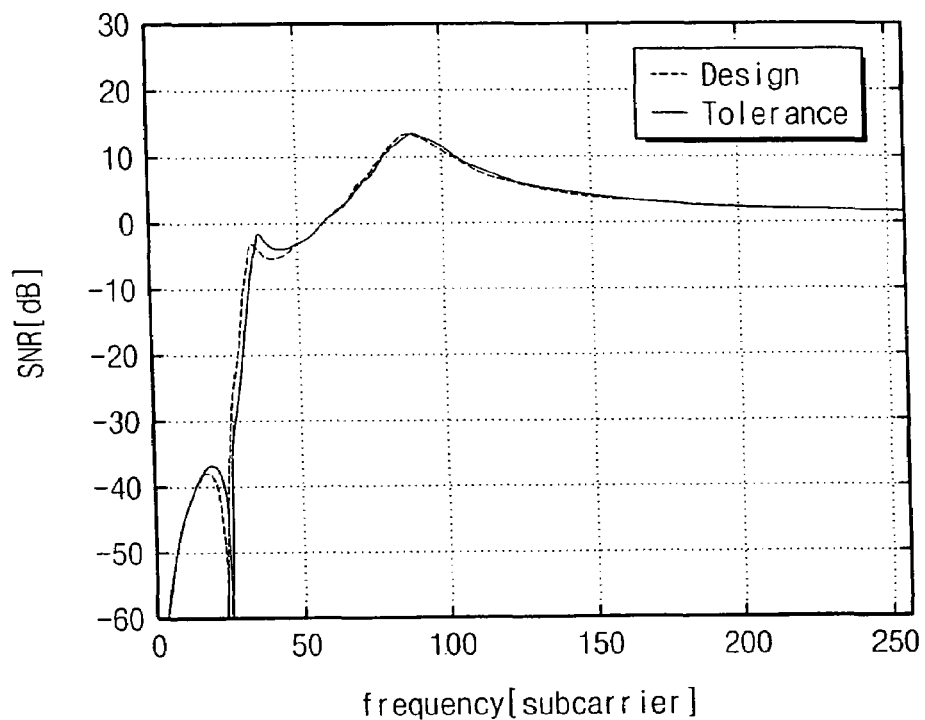
FIG. 4B is a graph illustrating variation of the transmitted frequency magnitude.
Figure 4C:
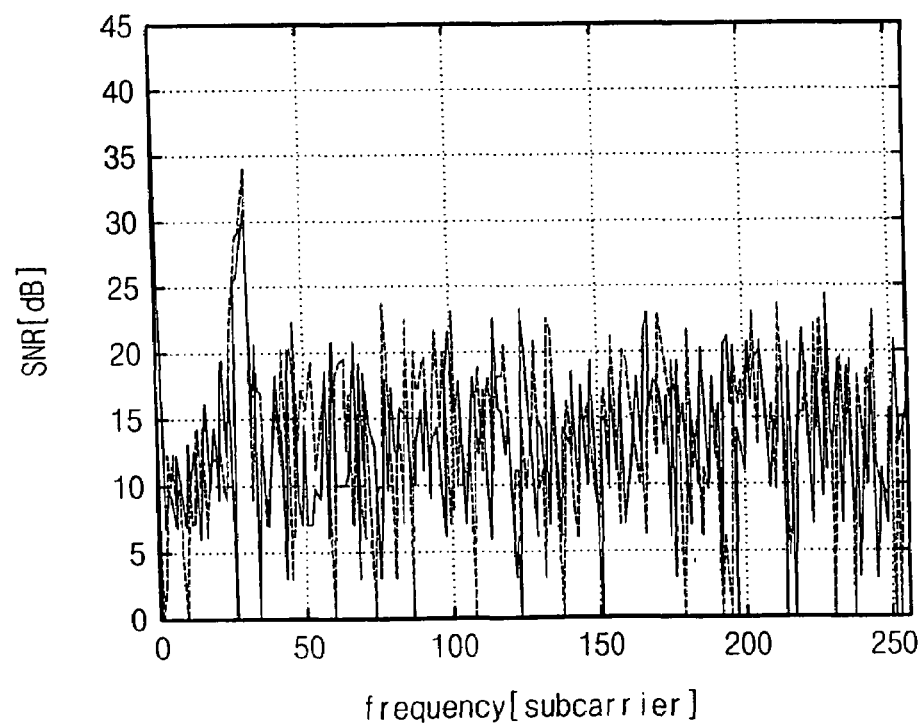
FIG. 4C is a graph illustrating the magnitude of reflect signals as received at the receiving terminal.

In the ADSL system, transmitting and receiving operations are performed on the same telephone line, such that the ADSL system includes a hybrid circuit 300 for integrating or separating the transmission signal and the receipt signal. Therefore, variation of the transmission signal directly affects the receipt signal and affects receiving performance of the system. Accordingly, various elements are considered in system design in order to prevent the receipt signals from being affected due to variation in the transmission signals. However, the circuits for integrating or separating the transmitted or receipt signals include passive analog devices (i.e., discrete components) such as a resistor, a capacitor, an inductor, etc. and active devices such as an amplifier and so forth. Each of the devices has an associated permissible tolerance, and, as a result, the circuits may have characteristics and therefore a performance that are slightly different from specified design specifications. In the hybrid circuit 300, permissible tolerance in the analog devices changes, for example, the magnitude of the transmission signal and, therefore, the magnitude of the reflect signal flowing into the receiving terminal. FIGS. 4A through 4C show the transmission signal and magnitude of the reflected signal flowing into a receiving terminal that is varied according to the permissible tolerance of the discrete components when an analog filter is embodied to a hybrid circuit 300. FIG. 4A shows a hybrid circuit 300 and FIG. 4B shows a magnitude variation of the transmission signal in the frequency domain. The dotted line illustrates frequency characteristics of the transmission signal according to circuit design and the solid line illustrates frequency characteristics of the transmission signal varied by permissible tolerance of the hybrid circuit 300. FIG. 4C shows the reflect signal flowing into the receiving terminal. The dotted line illustrates frequency characteristics of receipt signals according to the circuit design and the solid line illustrates frequency characteristics of receipt signals varied by permissible tolerance of a hybrid circuit 300. As illustrated in FIG. 4C, magnitude variation of reflect signals flowing into the receiving terminal distorts the receipt signal (RD) restored by DMT controller 110. That is, even when the magnitude of the receipt signal is smaller than an actual reference value of automatic gain control, the receiving part of the ADSL system may determine that the magnitude of the reflect signal is the same as the reference value of the automatic gain control due to large magnitude in the reflect signal. In this case, system performance is not optimized to the given condition, such that the system performance is conclusively lowered.

In order to minimize effect of the permissible tolerance of the hardware device, a predetermined signal is transmitted and the magnitude of the resulting reflect signal at a receiving terminal is measured before commencement of actual communication, thereby compensating the reference value used for automatic receipt gain control. According to the procedure of the present invention, diagnosis for detecting characteristics of the entire system hardware is performed after applying power to the system before active communication is commenced. The diagnosis process is illustrated in FIG. 5.

Referring to FIGS. 1 and 5, in step S300, a transmitting part transmits a REVERB signal (i.e., an initializing signal) and a receiving part receives the REVERB signal for a time period, for example 1 second, which is transmitted from the transmitting part and received through the hybrid 300. The REVERB signal received over the 1 second period includes 10 frames. The profiler 240 stores the REVERB signal of each frame. Therefore, symbols of 10 frames are stored in the profiler 240 during the 1 second time span.

In step S310, a slicer 250 calculates an average value Fe of the symbols of the 10 frames stored in the profiler 240. The average value Fe is a magnitude of the reflect signal.

Figure 6:
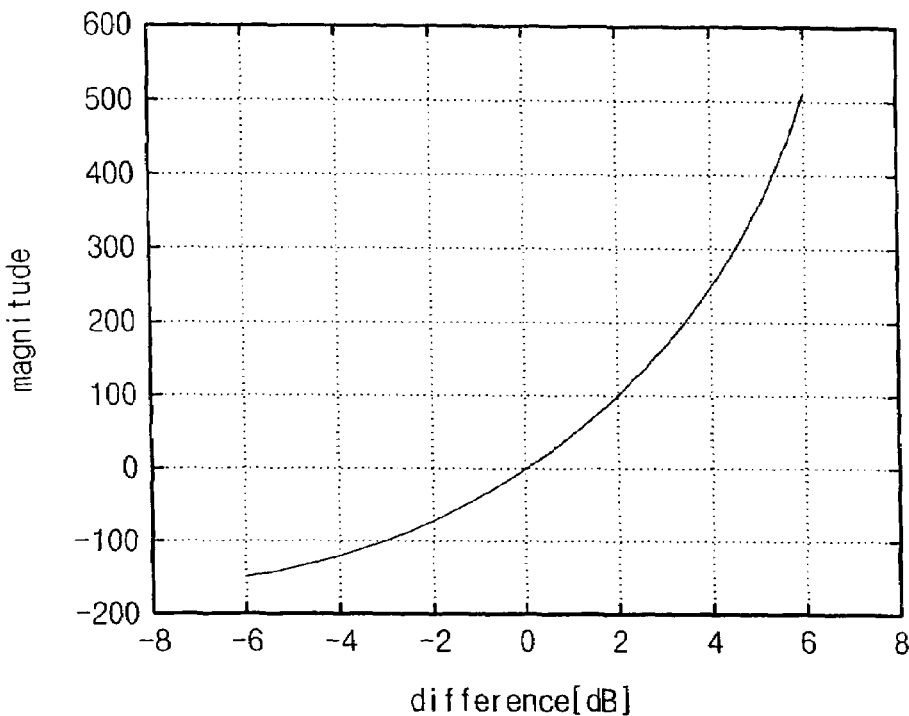
FIG. 6 is a graph showing the properties of the look-up table illustrated in FIG. 1.

In step S320, the slicer 250 determines whether the calculated average value Fe is identical to a reference value Fref. When the average value Fe is the same as the reference value Fref, the control proceeds to step 330, and compensation value α is set to 1. When the average value Fe is not identical to the reference value Fref, the control proceeds to step 340. In step S340, the slicer 250 determines a compensation value α corresponding to the average value Fe referring to look-up table 270 illustrated in FIG. 6.

The compensation value α is determined according to the reflect signal affected by characteristics of digital filter and the like. When the variation of the receipt signal is linear, the compensate value α has the values of FIG. 6. Obtaining more accurate value α requires a calculation of approximate value on the basis of the values achieved by varying set values of the system components such as the hybrid circuit 300, band pass filters 140 and 210, the digital-analog converter 120, the analog-digital converter 230, etc. and then is formulated accordingly.

Figure 7:
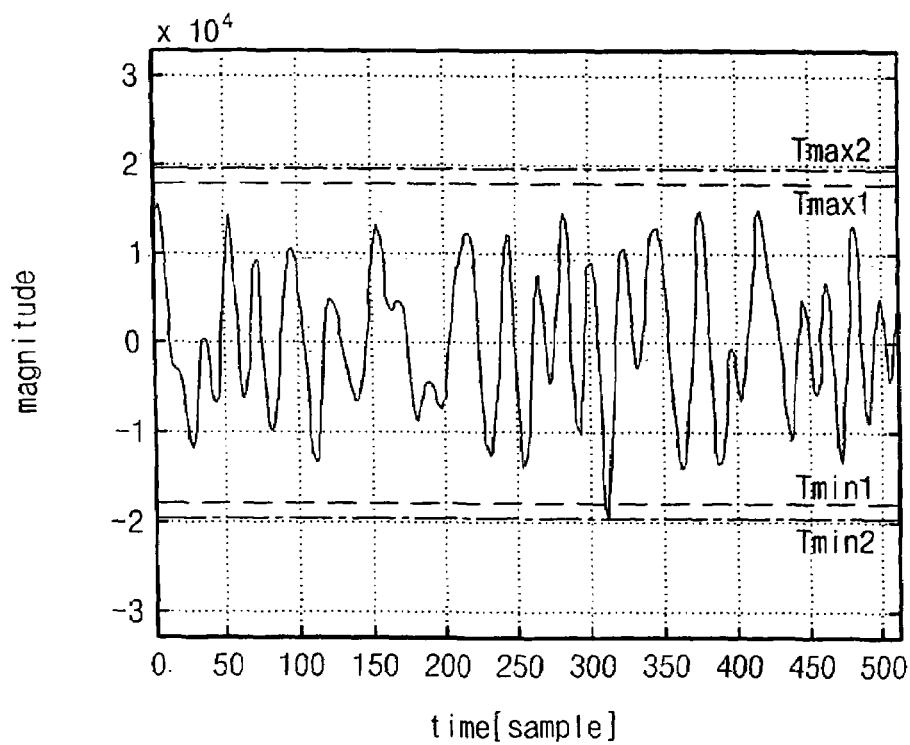
FIG. 7 is a graph showing exemplary variation of each of the minimum and maximum values in the case where the signals received through the hybrid circuit do not stay within the receivable range.

The compensation value α set by the slicer 250 is provided to an automatic gain controller 260. The automatic gain controller 260 adjusts the gain of amplifier 220. FIG. 7 shows the result of a process of controlling gain of the receipt signals according to the method for controlling gain in accordance with the present invention. In a system in which the gain of the amplifier 220 is established to set the maximum value of the receipt signal to be Tmax1 and the minimum value to be Tmin1, respectively, distorting of the maximum value may occur due to a variation of the reflect signal generated by the transmission signal at the receiving terminal when characteristics of the hybrid circuit 300 are different from what is used when the maximum value of the receipt signal is determined. The characteristic difference of the hybrid circuit 300 is caused by permissible tolerance of the components constituting devices (e.g., the hybrid circuit 300, the band pass filters 140 and 210, the digital-analog converter 120, the analog-digital converter 230, etc.). As illustrated in FIG. 7, if the signals received through the hybrid circuit are not within the range of receipt signal Tmax1-Tmin1, the maximum and minimum values are changed to Tmax2 and Tmin2. To change maximum and minimum values (i.e., the range of receipt signal), initialization signals received over the course of a predetermined time period are stored in the profiler 240 and a compensation value α is calculated according to the difference between the average value and the reference value. The automatic gain controller 260 controls each of the maximum and minimum values of the receipt signal according to the compensation value α of the automatic gain controller 260. Therefore, the amplifier 220 amplifies the receipt signal from a band pass filter 210 to be within the maximum and minimum values determined by the gain controller 260. Accordingly, the gain of the receipt signal is thereby controlled to cause the ADSL system to have optimized performance under given conditions in the manner described above.

According to the present invention, when permissible tolerance of the analog discrete components used in the ADSL system changes the system performance, the gain of the gain amplifier is automatically controlled. Thus, the ADSL system can have optimized performance under given conditions.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A method for controlling receipt gain in a digital communication system including a transmitter and a receiver for communicating data on a telephone line comprising:

receiving an initialization signal through a hybrid circuit for a time period, wherein the initialization signal is output by the transmitter and transferred on the telephone line;

comparing an average magnitude value of the initialization signal received during the time period and a reference magnitude value;

adjusting at least one of a maximum magnitude value and a minimum magnitude value of a receipt signal when the average magnitude value of the initialization signal is different than the reference magnitude value; and controlling the receipt gain such that the receipt signal is between the maximum magnitude value and minimum magnitude value of the receipt signal according to the difference between the average magnitude value of the received initialization signal and the reference magnitude value.

2. The method of claim 1, wherein the receipt gain is decreased when the average magnitude value of the received initialization signal is larger than the reference magnitude value.

3. The method of claim 1, wherein the receipt gain is increased when the average magnitude value of the received initialization signal is smaller than the reference magnitude value.

4. The method of claim 1, wherein the digital communication system is an asymmetric digital subscriber line (ADSL).

5. The method of claim 4, wherein the initialization signal is a REVERB signal.

6. The method of claim 4, wherein the initialization signal is a MEDLEY signal.

7. The method of claim 4, wherein the time period corresponds to 10 frames of signals.

8. A digital communication system for communicating using a telephone line comprising:

a hybrid circuit connected to the telephone line;

a transmitter for transmitting an initialization signal on the telephone line through the hybrid circuit; and a receiver including an amplifier for amplifying a receipt signal and the initialization signal received through the hybrid circuit;

wherein the receiver controls gain of the amplifier according to a difference between an average magnitude value of an initialization signal received through the hybrid circuit at the receiver during a time period and a reference magnitude value, and wherein the receiver adjusts at least one of a maximum magnitude value and a minimum magnitude value of the receipt signal when the average magnitude value of the initialization signal is different than the reference magnitude value.

9. The system of claim 8, wherein the receiver decreases the gain of the amplifier when the average magnitude value of the received initialization signal is larger than the reference magnitude value.

10. The system of claim 8, wherein the receiver increases the gain when the average magnitude value of the received initialization signal is smaller than the reference magnitude value.

11. The system of claim 8, wherein the receiver comprises:
- a demodulator for demodulating the initialization signal amplified by the amplifier; and
- a gain controller for storing the initialization signal demodulated by the demodulator received during the time period and for controlling the gain of the amplifier according to a difference between the average magnitude value of the stored initialization signal and the reference magnitude value.

12. The system of claim 11, wherein the gain controller comprises:
- a profiler for storing the initialization signal demodulated by the demodulator during the time period;
- a look-up table for defining compensation values corresponding to differences between the magnitude of the received initialization signal and the reference magnitude value;
- a slicer for calculating an average magnitude value of the initialization signal stored in the profiler and determining a compensation value according to a difference between the average magnitude value of the initialization signal and the reference magnitude value with reference to the look-up table; and
- an automatic gain controller for controlling the gain of the amplifier according to the determined compensation value.

13. The system of claim 8, wherein the digital communication system is an asymmetric digital subscriber line system.

14. The system of claim 13, wherein the initialization signal is a REVERB signal.

15. The system of claim 13, wherein the initialization signal is a MEDLEY signal.

16. The system of claim 13, wherein the time period corresponds to 10 frames of signals.

17. A digital communication system for communicating using telephone line comprising:
- a hybrid circuit connected to the telephone line;
- a transmitter for transmitting an initialization signal on the telephone line through the hybrid circuit; and
- a receiver including an amplifier for amplifying the initialization signal received through the hybrid circuit;

wherein the receiver controls gain of the amplifier according to a difference between an average magnitude value of an initialization signal received through the hybrid circuit at the receiver during a time period and a reference magnitude value, wherein the receiver comprises:
- a demodulator for demodulating the initialization signal amplified by the amplifier; and
- a gain controller for storing the initialization signal demodulated by the demodulator received during the time period time and for controlling the gain of the amplifier according to a difference between the average magnitude value of the stored initialization signal and the reference magnitude value, wherein the gain controller comprises:
  - a profiler for storing the initialization signal demodulated by the demodulator during the time period;
  - a look-up table for defining compensation values corresponding to differences between the magnitude of the received initialization signal and the reference magnitude value;
  - a slicer for calculating an average magnitude value of the initialization stored in the profiler and determining a compensation value according to a difference between the average magnitude value of the initialization signal and the reference magnitude value with reference to the look-up table; and
  - an automatic gain controller for controlling the gain of the amplifier according to the determined compensation value.

18. The system of claim 17, wherein the receiver decreases the gain of the amplifier when the average magnitude value of the received initialization signal is larger than the reference magnitude value.

19. The system of claim 17, wherein the receiver increases the gain when the average magnitude value of the received initialization signal is smaller than the reference magnitude value.

20. The system of claim 17, wherein the digital communication system is an asymmetric digital subscriber line system.

21. The system of claim 20, wherein the initialization signal is a REVERB signal.

22. The system of claim 20, wherein the initialization signal is a MEDLEY signal.

23. The system of claim 20, wherein the time period corresponds to 10 frames of signals.

* * * * *